United States Patent [19]
Innes et al.

[11] Patent Number: 5,519,560
[45] Date of Patent: May 21, 1996

[54] UNITY GAIN FILTER FOR CURRENT TRANSFORMER

[75] Inventors: Mark E. Innes, Asheville, N.C.; Nicholas G. Muskovac, Palm Harbor, Fla.

[73] Assignee: Eaton Corporation, Cleveland, Ohio

[21] Appl. No.: 203,910

[22] Filed: Mar. 1, 1994

[51] Int. Cl.$^6$ .................................................. H02H 3/08
[52] U.S. Cl. .................................................. 361/87; 361/93
[58] Field of Search ...................... 361/86, 87, 94, 361/95, 96, 97, 100, 113

[56] References Cited

U.S. PATENT DOCUMENTS

| | | | |
|---|---|---|---|
| 4,482,852 | 11/1984 | Muskovac | 318/729 |
| 4,933,801 | 6/1990 | Glennon et al. | 361/45 |
| 4,943,766 | 7/1990 | Suzuki | 361/86 |
| 5,270,898 | 12/1993 | Elms et al. | 361/96 |

*Primary Examiner*—Todd Deboer
*Attorney, Agent, or Firm*—Martin J. Moran

[57] ABSTRACT

An electrical device such as an electrical contactor interfaces at least one alternating current transformer having an output providing a signal proportional to changes in alternating current and includes at least one filter for filtering the output signal of the transformer. Each of the filters have an input connected to the transformer and an output having a signal proportional to the transformer output signal and inversely proportional to selected frequencies of the alternating current. The electrical device also has means for determining a value related to the alternating current using the output of each of the filters. The filter may have a resistor and a capacitor for filtering the transformer output signal in order that the filter is a low-pass filter. Alternatively, the filter may be a band-pass filter. The electrical device may include a microcomputer having an integrating capacitor and an analog-to-digital converter for converting the output of each of the filters to a digital value related to, or equal to, the alternating current. Alternatively, the electrical device may have a rectifier for inverting an output signal of each of the filters and a summer for summing only one polarity of the output signal and the inverted output signal in order that the output value is an analog value related to, or equal to, the alternating current. The alternating current may have a silicon controlled rectifier chopped waveform.

19 Claims, 7 Drawing Sheets

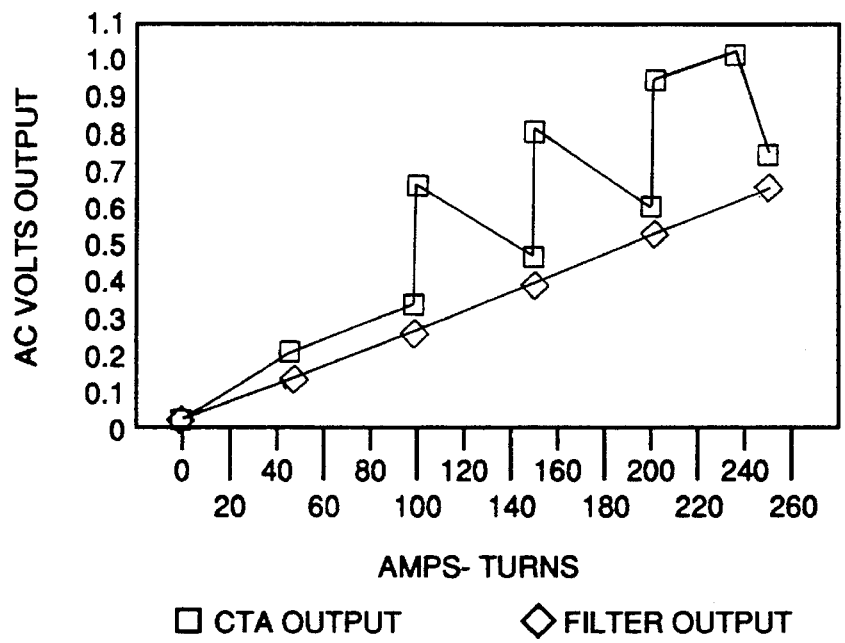
□ CTA OUTPUT   ◇ FILTER OUTPUT
FIG. 3

FIG. 4D ○—

UNITY GAIN FILTER FOR CURRENT TRANSFORMER

BACKGROUND OF THE INVENTION

1. Field of the Invention

This invention is directed to a unity gain filter for a current transformer, and more particularly to such a filter utilized by an electrical device, such as an electrical contactor, for filtering the output of a di/dt toroidal current transformer and maintaining current sensing accuracy for a chopped silicon controlled rectifier (SCR) current waveform sensed by the current transformer.

2. Background of Information

Toroidal transformers are generally utilized to sense current flowing in a power line conductor. In particular, di/dt current transformers are used to sense changes in such current. The di/dt current transformers operate by sensing changes in flux in their core and produce an output signal that is proportional to the change in current flowing through the core (i.e., a derivative of the core current). Under conventional operation, with alternating current having a generally sinusoidal (sine) waveform, the derivative of the alternating current is also a generally sinusoidal (cosine) waveform. Thus, conversion of the output signal of the current transformer to a value representing the alternating current is relatively straightforward using well-known analog rectification or integration and analog-to-digital conversion techniques.

However, whenever the rate of change of the alternating current is large, such as the case where higher frequency harmonics are present in the alternating current waveform, then the current transformer output signal is also large. In this case, the conversion of the current transformer output signal to a value representing the true alternating current is not directly possible. This is because the current transformer does not produce an accurate sinusoidal output signal in relation to the input alternating current and, instead, distorts the true alternating current waveform. Such distortion is likely in a power system having a chopped SCR alternating current waveform. This is because the chopped SCR waveform is not sinusoidal and contains many higher frequency harmonic components.

There is a need, therefore, for an electrical circuit for a current transformer that maintains current sensing accuracy for currents sensed through the transformer.

There is a more particular need for an electrical circuit for a di/dt current transformer that maintains current sensing accuracy for a chopped SCR current waveform.

There is another more particular need for an electrical circuit for a di/dt current transformer that maintains current sensing accuracy for a current waveform having third, fifth and seventh order harmonics.

SUMMARY OF THE INVENTION

These and other needs are satisfied by the invention which is directed to a unity gain filter for filtering an output signal of a di/dt toroidal current transformer. In accordance with the invention, a filter is provided for filtering the output signal from the current transformer. The filter provides a filtered output signal proportional to the output signal of the current transformer and inversely proportional to selected frequencies of alternating current flowing through the transformer. An electrical device, which interfaces the current transformer, utilizes the filter and the filtered output signal to determine a value of current related to, or equal to, the alternating current flowing through the current transformer. In embodiments utilizing multiple current transformers, multiple filters, associated with the transformers, are provided.

In one embodiment of the invention, the filter is a band-pass filter having an operational amplifier, resistors and capacitors. The filter attenuates selected frequencies of the alternating current that are above and below a nominal line frequency of the alternating current. In particular, one of the selected frequencies is generally greater than the nominal line frequency of the alternating current. A second selected frequency is generally lower than the nominal line frequency of the alternating current. Furthermore, a rectifier inverts an output voltage of the filter and subtracts negative values of the output voltage and the inverted output voltage in order to obtain a positive analog value related to, or equal to, the analog alternating current flowing through the current transformer. The analog value is utilized in an associated analog electrical device.

In an alternative embodiment of the invention, the filter is a low-pass filter having a resistor and a capacitor. The filter attenuates frequencies of the alternating current that are generally greater than a selected frequency below a nominal line frequency of the alternating current. Furthermore, a microcomputer, having an integrator and an analog-to-digital converter, integrates and converts the analog output signal of the filter to a digital value related to, or equal to, the analog alternating current flowing through the current transformer. The digital value is utilized in an associated electrical device, such as an electrical contactor, which is controlled by the microcomputer.

BRIEF DESCRIPTION OF THE DRAWINGS

A full understanding of the invention can be gained from the following description of the preferred embodiments when read in conjunction with the accompanying drawings in which:

FIGS. 1A–2B are is a schematic of the embodiment of FIG. 1 having a three-phase band-pass filter and a three-phase rectifier in accordance with the invention;

FIG. 3 is a graph comparing filtered and unfiltered current transformer output characteristics;

FIG. 4D is a graph illustrating a filtered and rectified output signal representative of the filtered output of three of the current transformers of FIG. 4B;

DESCRIPTION OF THE PREFERRED EMBODIMENT

Figure 1:
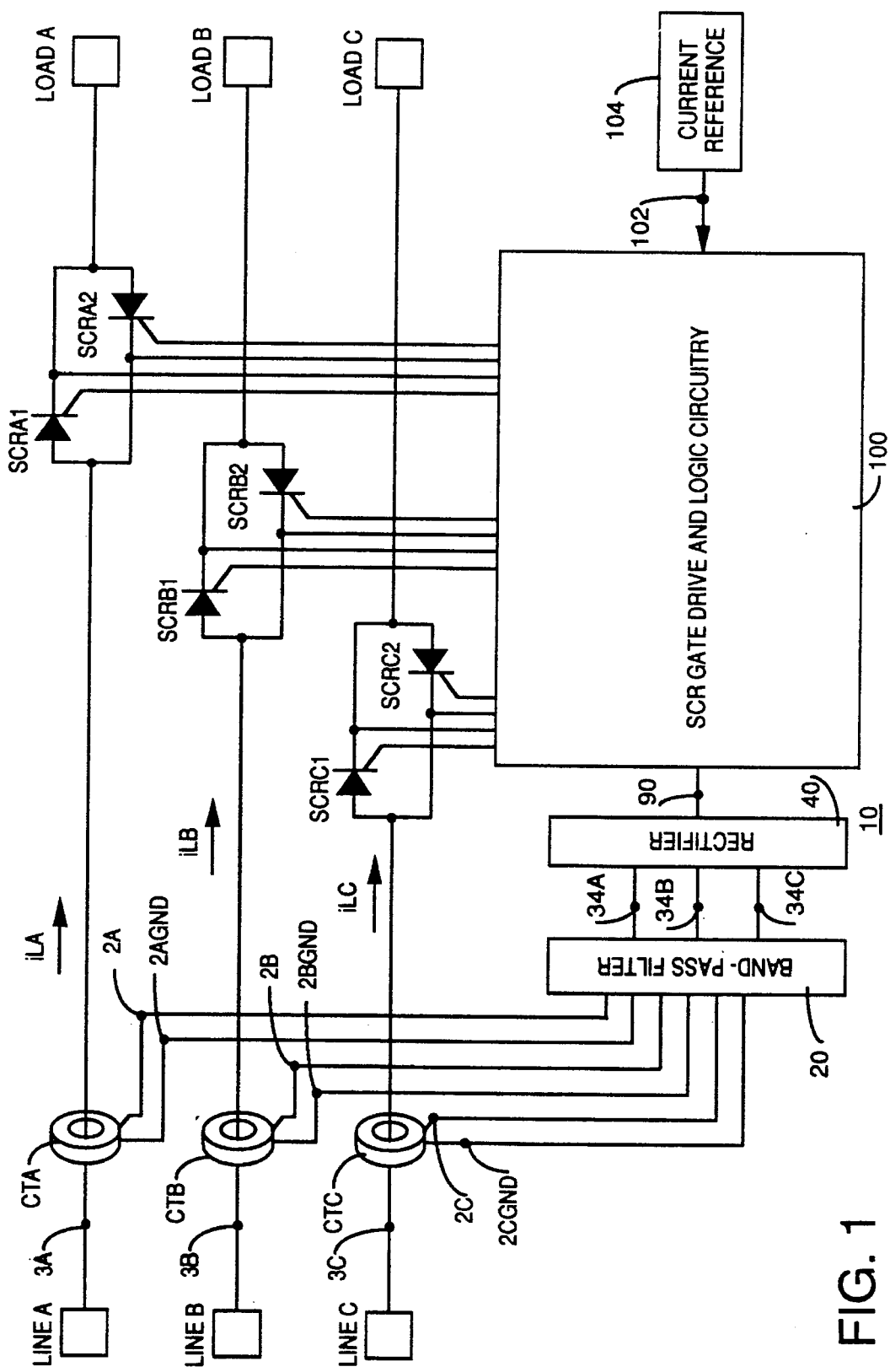
FIG. 1 is a block diagram and schematic of an embodiment of the invention having a band-pass filter.

Referring to FIG. 1, a block diagram and schematic of an embodiment of the invention in an electrical device 10 having a three-phase band-pass filter 20 is illustrated. An alternating current power source having three power lines LINE A, LINE B, LINE C is interconnected to a load LOAD A, LOAD B, LOAD C, such as a motor, by a 6-SCR circuit SCRA1, SCRA2, SCRB1, SCRB2, SCRC1, SCRC2. It being understood that the invention is applicable to any number of power line phases, any type of power interconnection and any type of load. Conductors 3A, 3B, 3C interconnect the three power lines LINE A, LINE B, LINE C with the 6-SCR circuit and pass through current transformers CTA, CTB, CTC which sense currents iLA, iLB, iLC flowing in the conductors, respectively. The current transformers CTA, CTB, CTC each have an output 2A, 2B, 2C and an output ground reference 2AGND, 2BGND, 2CGND, respectively. The three current transformers CTA, CTB, CTC each produce an output signal that is a derivative of the respective power line current iLA, iLB, iLC.

The output signal of each current transformer is provided to three-phase band-pass filter 20. The band-pass filter 20 produces three filtered output voltages 34A, 34B, 34C which are connected to a three-phase rectifier 40 which inverts the filtered output voltages 34A, 34B, 34C and subtracts negative values of the filtered output voltages and the inverted filtered output voltages to produce an output signal 90, representative of the three-phase power line current iLA, iLB, iLC.

Finally, the SCR gate drive and logic circuitry 100 uses, in a manner known to those skilled in the art, the output signal 90, representative of three-phase load current, and a reference signal 102 from a current reference 104 to control the load current by sequentially firing the SCR's of the 6-SCR circuit. It being understood that the invention is applicable to a variety of electrical devices, such as the exemplary gate drive and logic circuitry for an analog contactor, as well as other electromechanical devices, such as a circuit interrupter or a circuit breaker, which sense a power line current using a di/dt current transformer.

Figure 2A:
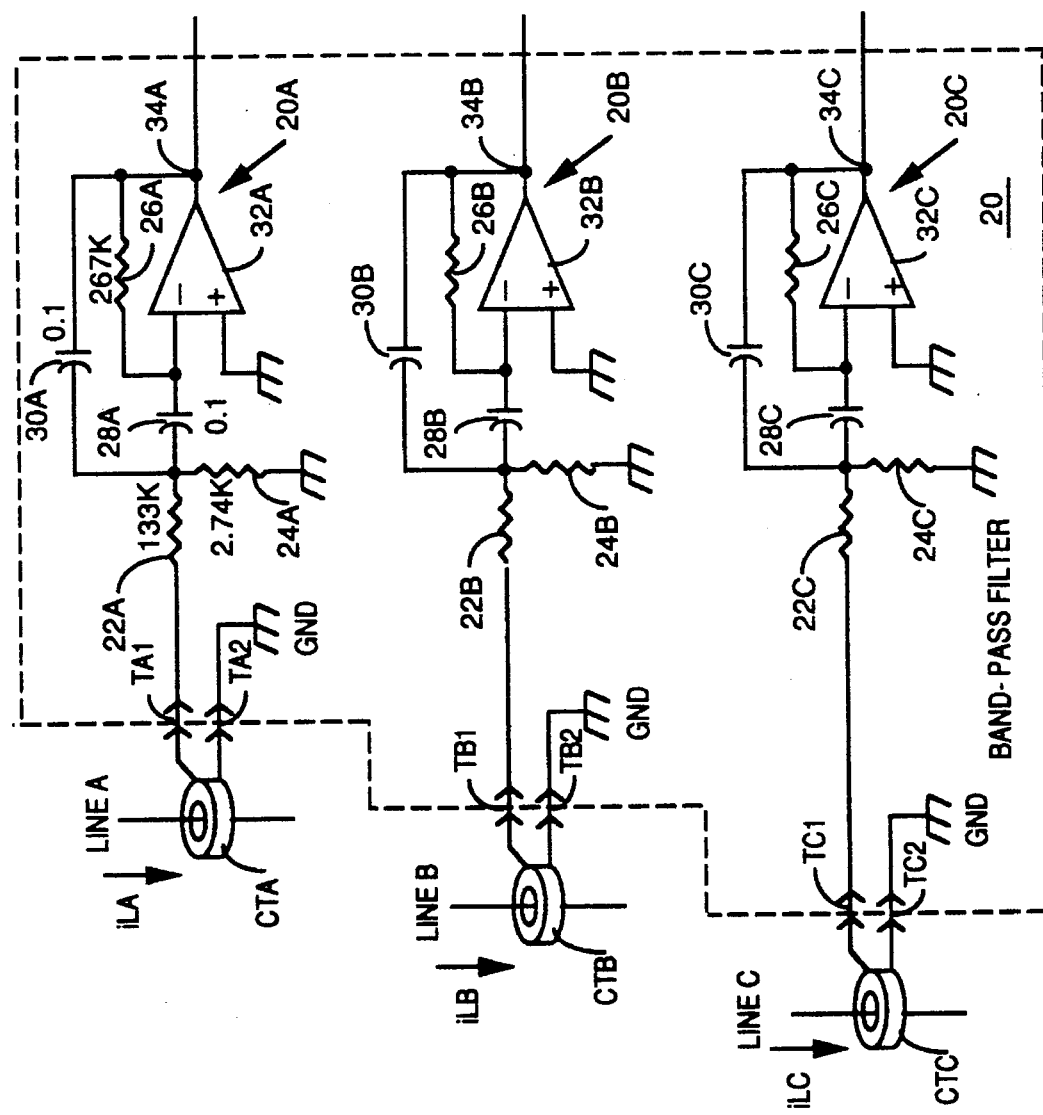
Figure 2B:
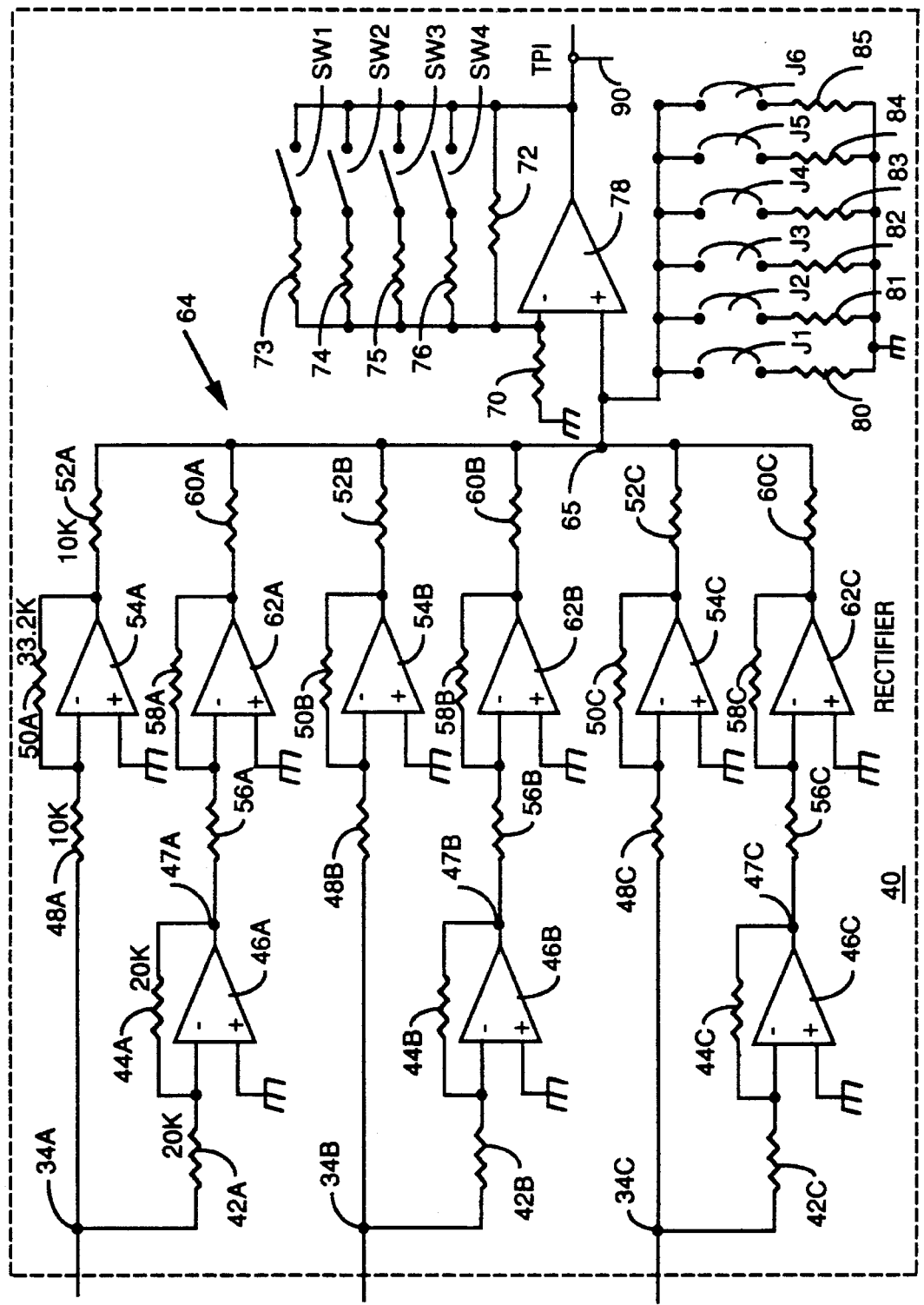

Referring now to FIGS. 2A–2B, a schematic of the embodiment of FIG. 1 having three band-pass filters 20A, 20B, 20C and three-phase rectifier 40 is illustrated. In the exemplary embodiment, the three band-pass filters 20A, 20B, 20C each have a center frequency of 60 Hz. It being understood that the invention is applicable to any line frequency and any number of phases. For simplicity of description, only the operation of filter 20A is described, it being understood that the other filters 20B, 20C operate in a like manner for the other phases. Filter 20A comprises terminals TA1, TA2; resistors 22A, 24A, 26A; capacitors 28A, 30A; and operational amplifier 32A. The outputs 2A, 2AGND (shown in FIG. 1) of the LINE A current transformer CTA are interconnected with filter 20A by terminals TA1, TA2, respectively. Terminal TA2 is connected to a local ground at filter 20A and is also connected to the other ground terminals TB2, TC2.

The output 34A of filter 20A is connected to rectifier 40 in a manner to be described in detail below. In the exemplary embodiment, in a manner understood by those skilled in the art, the filter 20A and its associated resistors and capacitors are selected to produce a gain of one and a Q of five at the 60 Hz center frequency. The exemplary gain of one being selected to ensure that the amplifiers of the rectifier 40 do not saturate under normal operation. The exemplary Q of five providing a suitable attenuation of selected frequencies above and below the center frequency. It being understood that the invention is applicable to other gains, Q's and center frequencies.

The filter 20A attenuates selected frequencies of alternating current iLA that are above and below the nominal line frequency of the alternating current. In the exemplary embodiment, the nominal line frequency is equal to the 60 Hz center frequency of filter 20A. One of the selected frequencies is generally greater than the 60 Hz nominal line frequency of the alternating current. The attenuation of these first frequencies, as understood by those skilled in the art, is proportional to the frequency of the alternating current. A second selected frequency is generally lower than the 60 Hz nominal line frequency. The attenuation of these second frequencies, as similarly understood by those skilled in the art, is inversely proportional to the frequency of the alternating current. In other words, the filter's output voltage for the first frequencies is inversely proportional to the frequency of the alternating current and the filter's output voltage for the second frequencies is proportional to the frequency of the alternating current.

Continuing to refer to FIGS. 2A–2B, three-phase rectifier 40 is comprised of three inverters 46A, 46B, 46C and a summer 64. In general, the inverters 46A, 46B, 46C invert the output voltage 34A, 34B, 34C of each of the filters and generate an inverted output voltage 47A, 47B, 47C, respectively. The summer 64 subtracts only negative values of the output voltages 34A, 34B, 34C and the inverted output voltages 47A, 47B, 47C to generate a positive analog value 65 related to the three-phase alternating current iLA, iLB, iLC flowing through the current transformers CTA, CTB, CTC. In the exemplary embodiment, the inverters 46A, 46B, 46C are operational amplifiers which generate a virtual ground at their negative input in order that the inverted output voltage 47A, 47B, 47C is across feedback resistors 44A, 44B, 44C, respectively. Similarly, the inverters' input voltage 34A, 34B, 34C is across input resistors 42A, 42B, 42C, respectively. Those skilled in the art will appreciate that the absolute value of the inverted output voltages 47A, 47B, 47C is equal to the inverters' input voltage 34A, 34B, 34C, respectively, whenever, as in the exemplary embodiment, the value of the feedback resistors 44A, 44B, 44C equals the value of the input resistors 42A, 42B, 42C, respectively.

Still referring to FIGS. 2A–2B, the summer 64 subtracts negative values of the output voltages 34A, 34B, 34C and the inverted output voltages 47A, 47B, 47C and generates, as a positive sum, analog value 65. The summer 64 includes operational amplifiers 54A, 54B, 54C for the output voltages 34A, 34B, 34C, respectively; operational amplifiers 62A, 62B, 62C for the inverted output voltages 47A, 47B, 47C, respectively; input resistors 48A, 48B, 48C, 56A, 56B, 56C; feedback resistors 50A, 50B, 50C, 58A, 58B, 58C; and output resistors 52A, 52B, 52C, 60A, 60B, 60C. Each pair of operational amplifiers (e.g., 54A, 62A) subtracts negative values of the output voltage (e.g., 34A) and the inverted output voltage (e.g., 47A) associated with each current transformer (e.g., CTA), power line current (e.g., iLA) and phase (e.g., LINE A). In the exemplary embodiment, the ratio of the feedback resistor (e.g., 50A) to the input resistor (e.g., 48A) provides a gain of 3.32 for the positive sum generated at the analog value 65. The exemplary gain of 3.32 being selected to provide, as described in greater detail below, a 1.0 volt output signal 90 for a selected power line current scale.

Operational amplifier 78 provides gain adjustment and buffering of the analog value 65 and generates a signal 90 at test point TP1 representative of three-phase load current.

Switches SW1–SW4, associated with resistors 73–76, and resistors 70,72 provide a user-selectable gain adjustment. The switches SW1–SW4 have sixteen possible combinations, which correspond to power line currents of approximately 34A to 135A. Any individual combination of the switches SW1–SW4 equates a user-specified nominal power line current (e.g., 100A) with a nominal 1.0 volt value of the output signal 90. The exemplary output signal 90 may range from zero to five volts and, thus, is equated with a maximum power line current (e.g., 500A) that is five times greater than the nominal power line current. Jumpers J1–J6, associated with resistors 80–85, provide a user-selectable adjustment in order that the equivalent impedance of resistor 70 and resistors 72–76 may be matched at the positive input of operational amplifier 78.

Referring now to FIGS. 1–3, the graph of FIG. 3 illustrates filtered and unfiltered current transformer output characteristics. The graph plots a current transformer output before filtering (e.g., output 2A of FIG. 1) and after filtering (e.g., output 34A of FIGS. 2A–2B) in the vertical Y axis versus ampere-turns in the horizonal X axis. A large divergence of points is illustrated on the upper plot showing the current transformer output. However, the lower plot, associated with the filtered current transformer output, is generally linear.

Table I illustrates test results, for the exemplary embodiment of FIGS. 2A–2B, for a range of 0 to 660 ampere-turns in a current transformer. The results include a filtered alternating current output voltage (e.g., output 34A of FIGS. 2A–2B) and a ratio of ampere-turns divided by the filtered output voltage. The resulting ratio ranges from 378.2 to 391.0 and indicates the general linearity of the filtered output voltage.

TABLE I

| AMPERE-TURNS | FILTERED OUTPUT (VAC) | RATIO |
| --- | --- | --- |
| 131 | 0.335 | 391.0 |
| 230 | 0.606 | 379.5 |
| 250 | 0.661 | 378.2 |
| 324 | 0.846 | 383.0 |
| 370 | 0.967 | 382.6 |
| 387 | 0.995 | 388.9 |
| 390 | 1.01 | 386.1 |
| 463 | 1.20 | 385.8 |
| 554 | 1.44 | 384.7 |
| 660 | 1.71 | 386.0 |

Referring now to FIGS. 1, 2A–2B and 4A–4D, the graphs of FIGS. 4A–4D illustrate, respectively, an alternating current (e.g., iLA) flowing through a load, such as a motor; an output signal from a di/dt current transformer (e.g., CTA) sensing the load current; a filtered output signal (e.g., output 34A of FIGS. 2A–2B) representative of a filtered current transformer output; and a filtered and rectified output signal (e.g., output 65 of FIG. 2B) representative of the filtered output of three current transformers.

Figure 4A:
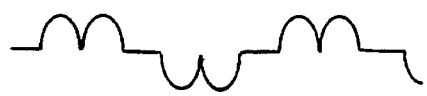
FIG. 4A is a graph illustrating current flowing through a motor.
Figure 4B:
FIG. 4B is a graph illustrating an output signal from a current transformer sensing the motor current of FIG. 4A.

In particular, FIG. 4A illustrates load or motor current (e.g., iLA). The graph of FIG. 4B illustrates the output signal of a current transformer (e.g., CTA of FIG. 2A) whenever the load or motor current equals the representation of FIG. 4A. Significant di/dt current changes in FIG. 4B are associated with points of zero current in FIG. 4A. This is because the change in current (di) is largest at these points which are higher frequency harmonics of a nominal alternating current line frequency.

Figure 4C:
FIG. 4C is a graph illustrating a filtered output signal representative of a filtered output of the current transformer of FIG. 4B.

FIG. 4C illustrates an output voltage of a filter (e.g., band-pass filter 20A of FIG. 2A) whenever the current transformer output of FIG. 4B (e.g., output 2A of FIG. 1) is applied at its input. The filter produces a generally sinusoidal output signal that is relatively free of harmonic frequencies. This is because the filter attenuates higher frequency components of the current transformer output in a manner similar to an amplification distortion introduced by the di/dt operation of the current transformer.

The graph of FIG. 4D illustrates a filtered and rectified output voltage (e.g., output signal 90 of FIG. 2B) of a rectifier (e.g., rectifier 40 of FIG. 2B). This voltage is generally a direct current representation of the three-phase motor current for the three power lines LINE A,LINE B,LINE C after processing by filters 20A,20B, 20C and rectifier 40 of FIGS. 2A–2B.

Figure 5A:
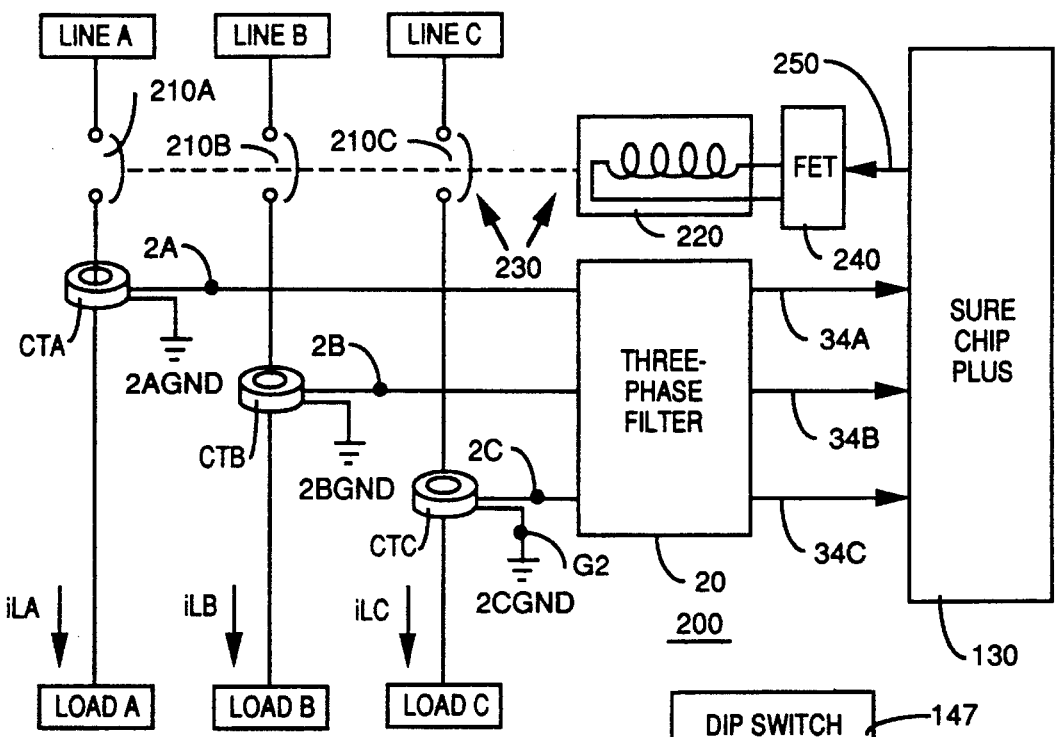
FIG. 5A is a block diagram and schematic of an electrical contactor having a three-phase filter, a microcomputer and separable contacts in accordance with the invention.

Referring now to FIG. 5A, an electrical contactor 200 is illustrated. An example of the electrical contactor 200 is disclosed in U.S. Pat. No. 5,315,471, issued May 24, 1994 to Rick A. Hurley et at. entitled "Coil Current Regulator with Induced Flux Compensation in an Electromagnetic Contactor System", which is herein incorporated by reference.

The contactor 200 includes separable contacts 210A, 210B,210C for selectively connecting three-phase power lines LINE A,LINE B,LINE C to three-phase load LOAD A,LOAD B,LOAD C, respectively. It being understood that the invention is applicable to power sources, loads and contactors having any number of phases. Three-phase current transformers CTA,CTB,CTC sense the three-phase alternating current iLA,iLB,iLC flowing through the current transformers. The output 2A of current transformer CTA is referenced to ground 2AGND and is connected to a three-phase filter 20. Similarly, the outputs 2B,2C of current transformers CTB,CTC are referenced to ground 2BGND, 2CGND, respectively, and are also connected to three-phase filter 20. The outputs 34A,34B,34C of three-phase filter 20 are connected to a "sure chip plus" microcomputer 130. The microcomputer 130 is disclosed in U.S. Pat. No. 5,270,898, issued Dec. 14, 1993 to Robert T. Elms et al. entitled "Sure Chip Plus", which is herein incorporated by reference.

As discussed in detail in U.S. Pat. No. 5,315,471, the microcomputer 130 outputs a control signal on line 250 to field effect transistor (FET) drive circuit 240 in order to regulate a pulsed direct current applied to an electromagnet 230 having a contactor coil 220. Whenever coil 220 is energized, separable contacts 210A,210B,210C are first closed and then are held closed in order to connect the three-phase power lines to the load. On the other hand, whenever coil 220 is deenergized, separable contacts 210A, 210B,210C are opened, thereby disconnecting the three-phase load from the power lines.

Figure 5B:
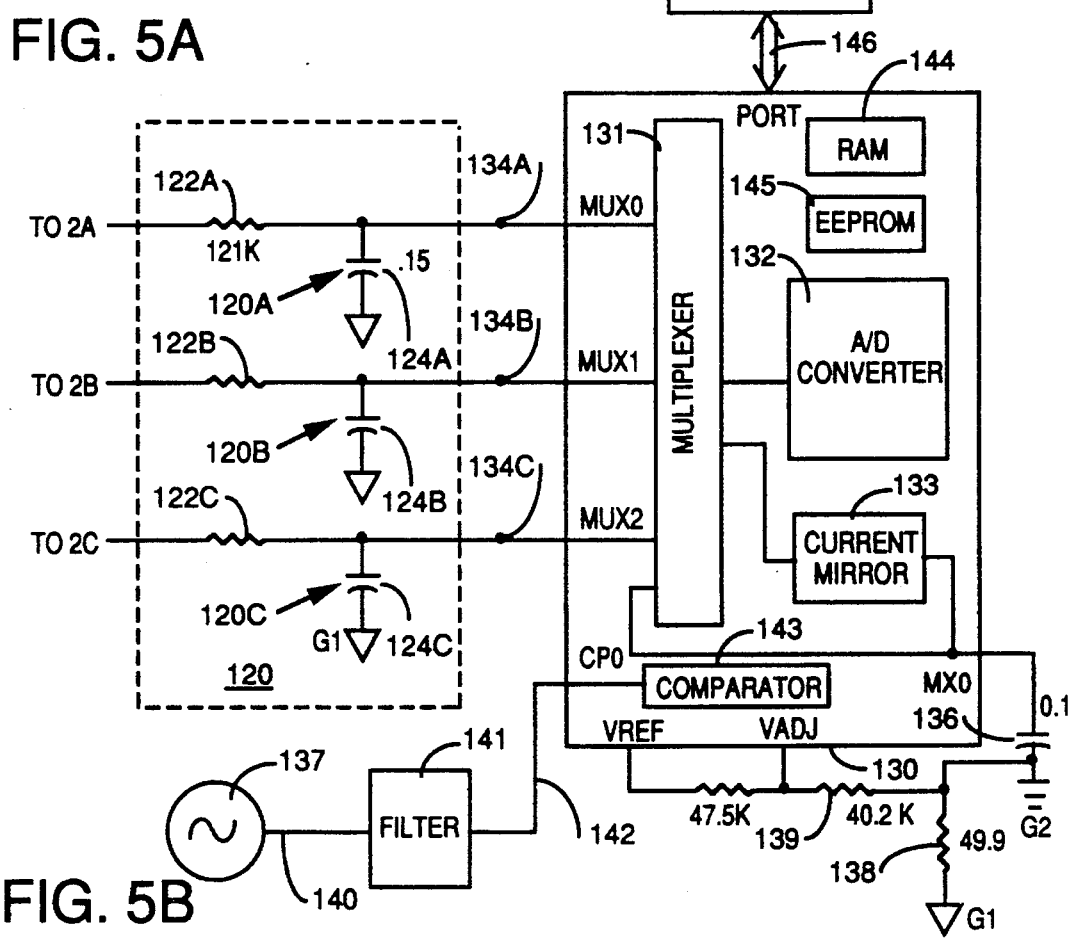
FIG. 5B is a block diagram and schematic of an alternative embodiment of the invention utilizing a three-phase low-pass filter and the microcomputer of FIG. 5A.

Referring now to FIG. 5B, an alternative embodiment of the invention having a three-phase low-pass filter 120 is illustrated. Output 2A of current transformer CTA (see FIG. 5A) is connected to a low-pass filter 120A comprising a series resistor 122A and a shunt capacitor 124A. Similarly, the outputs 2B,2C of current transformers CTB,CTC (see FIG. 5A) are connected to low-pass filters 120B,120C comprising resistors 122B,122C and capacitors 124B,124C, respectively. The outputs 134A,134B,134C of the filters 120A,120B,120C, respectively, are connected to the microcomputer 130. As discussed in detail in U.S. Pat. No. 5,270,898, the microcomputer 130 has a multiplexer 131 for selecting from an analog voltage input (MX0) and three current inputs (MUX0, MUX1 and MUX2), an analog-to-digital (A/D) converter 132 for converting a selected analog voltage from the multiplexer to an 8-bit digital value, a current mirror 133 for reproducing a current representative of a selected one of the current inputs, an external integration capacitor 136 for integrating a selected one of the current inputs in order to generate the voltage input MX0, and an external alternating current voltage source 137 for synchronizing integration and subsequent analog-to-digital conversion of the current inputs MUX0,MUX1,MUX2 associated with the sensed and filtered alternating currents iLA,iLB,iLC (see FIG. 5A), respectively. The current mirror 133 is an auto-ranging current source which sources, to the MX0 line and the external integration capacitor 136, current which is a programmable fraction of the (negative) current flowing out of the selected one of the current inputs MUX0, MUX1,MUX2.

As also discussed in detail in U.S. Pat. No. 5,270,898, the microcomputer 130 includes a CMOS switch (not shown) for disconnecting the MX0 line from current mirror 133 and shorting the MX0 input to ground G1. The multiplexer 131 includes switches (not shown) for selectively connecting a current input MUX0,MUX1,MUX2 to an input of current mirror 133 and for alternatively connecting a deselected current input MUX0,MUX1,MUX2 to ground G1. The microcomputer 130 further includes a random access memory (RAM) 144, an electrically erasable programmable read only memory (EEPROM) 145, and an input port 146. An external dual inline package (DIP) switch 147 is connected to the input port 146 to provide various configuration parameters that are discussed below.

In the exemplary embodiment, the common ground reference 2AGND, 2BGND,2CGND,G2 for the current transformers CTA,CTB,CTC (see FIG. 5A) and the external integration capacitor 136 is offset by approximately 15 mV with respect to the ground G1 for the filter capacitors 124A,124B,124C by a voltage divider comprising resistors 138 and 139. This 15 mV offset voltage compensates for an internal offset voltage of microcomputer 130. The exemplary filters 120A,120B,120C attenuate frequencies of alternating current that are generally greater than 55 Hz which is below a nominal 60 Hz line frequency of the alternating current. It being understood that the invention is applicable to any selected frequency which is below any nominal line frequency value.

The exemplary external voltage source 137 has a nominal 60 Hz line frequency that is equivalent to a frequency of power lines LINE A,LINE B,LINE C (see FIG. 5A). An output 140 of the voltage source 137 is connected to a filter 141. An output 142 of the filter 141 is connected to a CP0 input of a comparator 143 of the microcomputer 130. The comparator 143, in turn, generates an interrupt that corresponds to a rising edge zero crossing of the output 140 of the external voltage source 137.

Figure 6A:
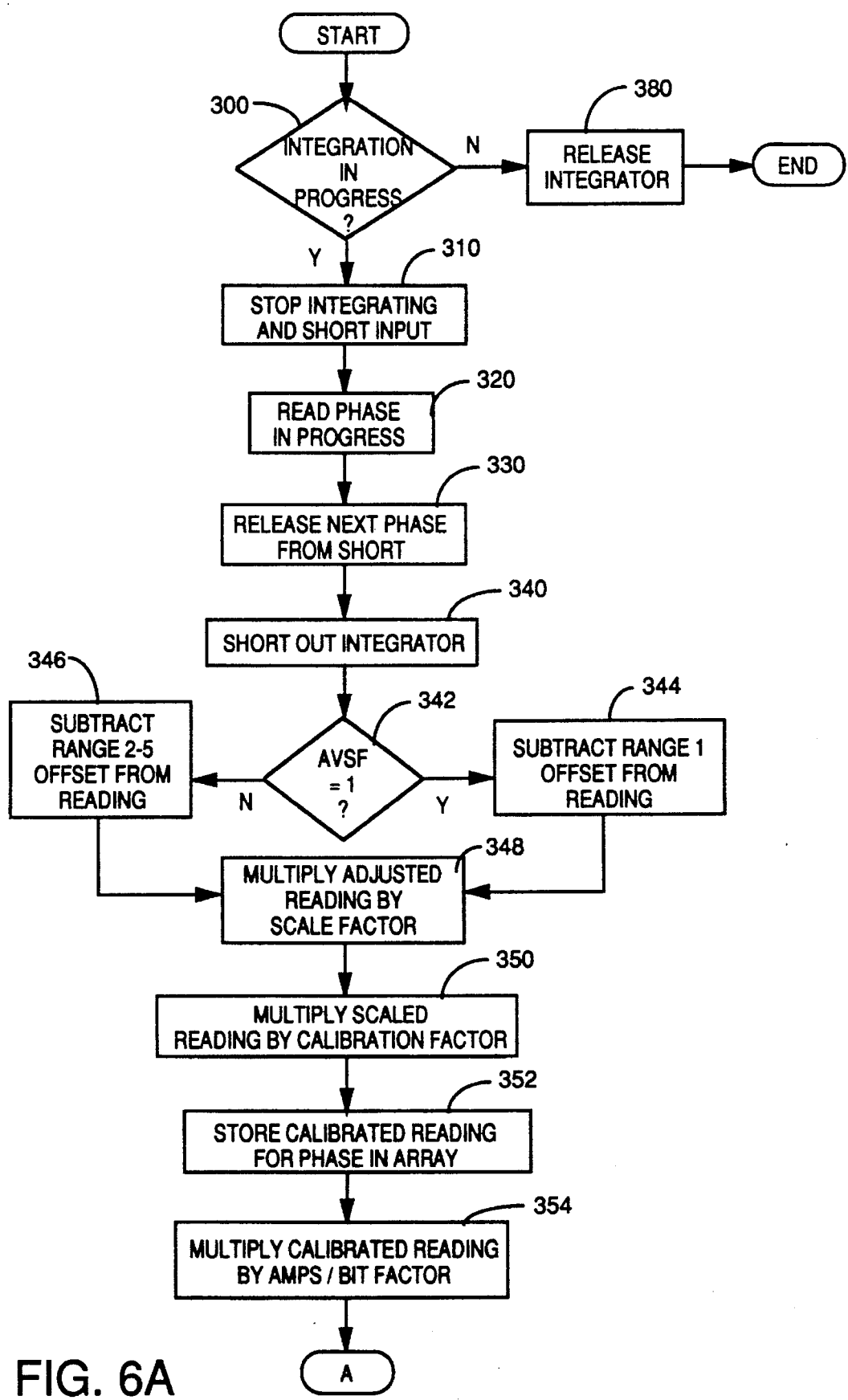
FIGS. 6A–6B are flowcharts of a firmware routine of the microcomputer of FIG. 5B in accordance with the invention.
Figure 6B:
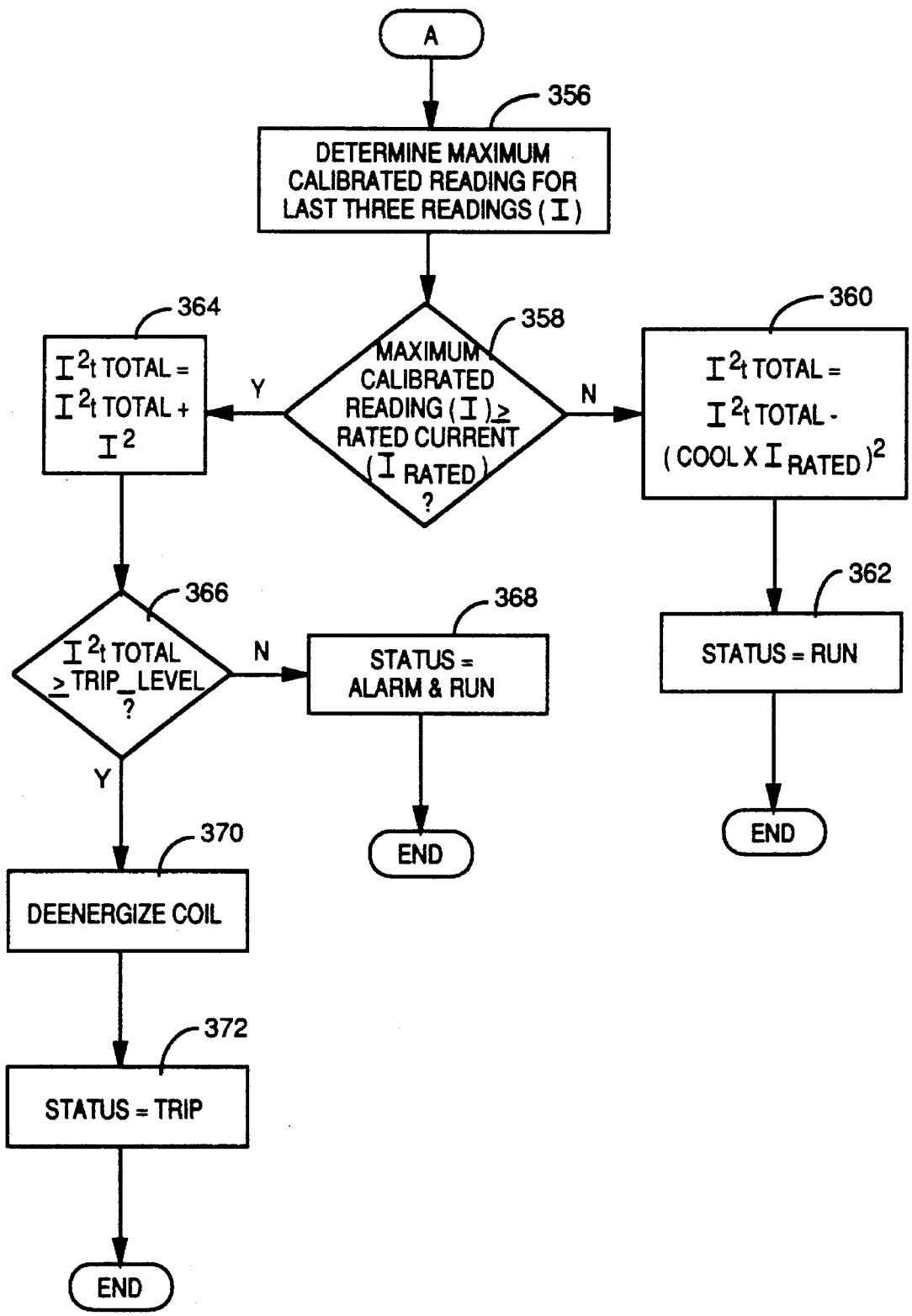

Referring now to FIGS. 6A–6B, flowcharts of a firmware routine of the microcomputer 130 of FIG. 5B is illustrated. This routine is used for integration and analog-to-digital conversion of the filtered outputs 134A,134B,134C (see FIG. 5B), adjusting the converted values for offset, scale and calibration factors, and deenergizing the coil 220 (see FIG. 5A) in response to the adjusted values.

The microcomputer 130 executes the routine in response to the interrupt that corresponds to the rising edge zero crossing of the output 140 of the external voltage source 137 (see FIG. 5B). The voltage source 137, thus, provides a uniform period of one line cycle (e.g., 16.667 mS at 60 Hz) for integration of the filtered outputs. If an integration of a previously selected current input (e.g., MUX0 for phase A) from one of the current transformers (e.g., CTA) is in progress, then the integration is stopped by shorting the selected current input to the microcomputer at step 310. On the other hand, if an integration of a previously selected current input is not in progress, an integration of a newly selected current input (e.g., MUX1 for phase B) is started, at step 380, by removing the short from the integration capacitor 136 (see FIG. 5B). A period of execution of the routine, thus, introduces a delay of approximately one line cycle, thereby allowing ample time for a filter (e.g., filter 120B for phase B) connected to a previously shorted current input (e.g., MUX1 for phase B) to settle.

For the case where an integration was in progress, and after step 310, an 8-bit digital value of the selected current input is converted by, and read from, analog-to-digital converter 132 (see FIG. 5B) at step 320. Next, at step 330, the next selected current input (e.g., MUX1 for phase B) from one of the current transformers (e.g., CTB) is selected by removing a previously applied short of the deselected current input to the microcomputer. At step 340, the integration capacitor 136 (see FIG. 5B) is shorted to prepare for the next integration cycle.

After the execution of steps 342–372, which are described in detail below, and in response to the next interrupt that corresponds to the rising edge zero crossing of the output 140 of the external voltage source 137 (see FIG. 5B), the routine determines whether an integration is in progress at step 300. In the case where an integration is not in progress (e.g., whenever the previous interrupt routine executed steps 310–340 and steps 342–372), then the integration of the next selected current input (e.g., MUX1 for phase B) is started, at step 380, by removing the short from the integration capacitor 136 (see FIG. 5B).

As an illustration, the next four interrupts include, for example, the following functions: (1) the digital value of the current input for phase B is read at step 320 and the current input for phase C is selected by removing a short of the input to the microcomputer; (2) the integration capacitor is released for phase C at step 380; (3) the digital value of the current input for phase C is read at step 320 and the current input for phase A is selected by removing a short of the input to the microcomputer; and (4) the integration capacitor is released for phase A at step 380. In this manner, for every six executions of the routine, three integrations are performed, and three corresponding analog-to-digital conversions are performed in order to obtain digital values of the current inputs for each of the phases A,B,C.

Furthermore, in every other execution of the routine, after execution of step 340, the routine adjusts each digital value for offset, scale and calibration factors, and determines whether to deenergize the coil 220 (see FIG. 5A). At step 342, an auto-ranging value of a voltage scale factor register (AVSF) is read and compared with one. If AVSF is equal to one, then at step 344, an offset value for range one is read from EEPROM 145 (see FIG. 5B) and is subtracted from the 8-bit digital value of the current input which was read at step 320. Otherwise, if AVSF is not equal to one, then at step 346, a common offset value for ranges two through five is read from EEPROM 145 and is subtracted from the 8-bit digital value of the current input which was read at step 320. Next, at step 348, after an adjusted value is calculated at either step 344 or 346, the adjusted value is multiplied by a scale factor (e.g., 1, 2, 4, 8 or 16) which corresponds to the AVSF value (e.g., 1, 2, 3, 4 or 5, respectively). At step 350, the scaled reading is multiplied by a calibration factor which is obtained from EEPROM 145. This step provides a digital value which directly corresponds to the respective current reading for LINE A,LINE B,LINE C (see FIG. 5A). At step 352, a calibrated reading for the current phase (e.g., phase A), obtained at step 350, is stored in an array in RAM 144 (see FIG. 5B). This array contains the last calibrated readings for each of the three phases. Then, at step 354, the calibrated reading of step 350 is multiplied by an amps per bit factor for the respective phase which is obtained from EEPROM 145. This step provides a digital value which equals the respective current reading (iLA,iLB,iLC) for the corresponding power line LINE A, LINE B, LINE C (see FIG. 5A).

The exemplary contactor 200 (see FIG. 5A) provides overload protection for the load, such as a motor, connected to the contactor. Accordingly, steps 356–372 determine whether to deenergize the coil 220 (see FIG. 5A). At step 356, a maximum calibrated reading (I) of the three calibrated readings in the array updated at step 352 is determined. Then, at step 358, the maximum calibrated reading (I) is compared to a rated current ($I_{RATED}$) from the DIP switch 147 and EEPROM 145 (see FIG. 5B). If I is less than $I_{RATED}$, then at step 360, an $i^2t$ TOTAL is updated by subtracting a factor, $(COOL \times I_{RATED})^2$, which reflects a cooling of the load, such as a motor, where COOL is obtained from EEPROM 145. At step 362, a status mode (STATUS) is set to a RUN condition and the routine exits. On the other hand, if I is greater than or equal to $I_{RATED}$, then at step 364, the $I^2t$ TOTAL is updated by adding a factor, $(I)^2$, which reflects a heating of the load, such as a motor. At step 366, the $I^2t$ TOTAL is compared to a TRIP__LEVEL value. The TRIP__ LEVEL value equals $(I_{RATED})^2 \times CLASS \times UPDATE\_FREQUENCY$, where CLASS is obtained from the DIP switch 147 and UPDATE__FREQUENCY (e.g., 60 updates per second for the exemplary 60 Hz line frequency) is obtained from EEPROM 145. If the $I^2t$ TOTAL is less than the TRIP__LEVEL, then the status mode (STATUS) is set to an ALARM & RUN condition at step 368 before the routine exits. Otherwise, if the $I^2t$ TOTAL is greater than or equal to the TRIP__LEVEL, then output 250 is used to deenergize the coil 220 (see FIG. 5A) at step 370. Finally, at step 372, the status mode (STATUS) is set to a TRIP condition and the routine exits.

Table II illustrates test results, for the exemplary embodiment of FIG. 5B, for a 10A alternating current (e.g., iLA of FIG. 5A) having various frequencies ranging from 60 Hz to 600 Hz. The resulting digital value, as determined by the microcomputer 130 at step 354, ranges from 9.3A to 10.1A and indicates the general linearity of the filtered current transformer output signal.

TABLE II

| FREQUENCY (Hz) | DIGITAL VALUE (A) |
| --- | --- |
| 60 | 10.1 |
| 120 | 9.4 |
| 180 | 9.8 |
| 240 | 9.8 |
| 300 | 9.3 |
| 360 | 9.6 |
| 420 | 9.6 |
| 480 | 9.6 |
| 540 | 9.6 |
| 600 | 9.8 |

While specific embodiments of the invention have been described in detail, it will be appreciated by those skilled in the art that various modifications and alternatives to those details could be developed in light of the overall teachings of the disclosure. Accordingly, the particular arrangements disclosed are meant to be illustrative only and not limiting as to the scope of the invention which is to be given the full breadth of the appended claims and any and all equivalents thereof.

What is claimed:

1. An electromagnetic contactor for selectively interconnecting a power source to a load, said electromagnetic contactor comprising:

at least one alternating current transformer having an output providing a signal proportional to changes in altering current flowing from said power source to said load;

at least one separable contact for selectively interconnecting said power source to said load;

electromagnetic means having a coil which is energized to close said at least one separable contact and to hold said at least one separable contact closed, and deenergized to open said at least one separable contact;

at least one filter means for filtering said output signal of said at least one current transformer, each of said at least one filter means having an input connected to said output of said at least one current transformer and an output;

said filter means having a frequency dependent gain which is inversely proportional to selected frequencies of said altering current;

means for determining at least one value equal to said alternating current, said determining means connected to said output of each of said at least one filter means; and means for energizing and deenergizing said coil in response to said at least one value equal to said alternating current.

2. The electrical device as recited in claim 1, wherein said at least one filter means further has a resistor and a capacitor for filtering said output signal of said at least one current transformer in order that said at least one filter means is a low-pass filter.

3. The electrical device as recited in claim 1, wherein said determining means is a microcomputer having an analog-to-digital converter for converting said output signal of each of said at least one filter means to a digital value equal to said alternating current.

4. The electrical device as recited in claim 1, wherein said alternating current has a silicon controlled rectifier chopped waveform.

5. An electrical device interfacing at least one alternating current transformer, each of said at least one alternating current transformer having an output providing a signal proportional to changes in alternating current flowing from a power source to a load, said electrical device comprising:

at least one filter means for filtering said output signal of said at least one current transformer, each of said at least one filter means having an input connected to said output of said at least one alternating current transformer and an output, said filter means having a frequency dependent gain which is inversely proportional to selected frequencies of said alternating current; and means for determining an output value related to said alternating current, said determining means connected to said output of each of said at least one filter means and having an output providing a value related to said alternating current.

6. The electrical device as recited in claim 5, wherein said at least one alternating current transformer further has a toroidal shape and surrounds a conductor conducting said alternating current.

7. The electrical device as recited in claim 5, wherein said at least one filter means further has a resistor and a capacitor for filtering said output signal of said at least one current transformer in order that said at least one filter means is a low-pass filter.

8. The electrical device as recited in claim 5, wherein said output signal of said at least one filter means further is proportional to other selected frequencies of said alternating current.

9. The electrical device as recited in claim 7, wherein said alternating current has a nominal line frequency and said selected frequencies of said alternating current are generally greater than a frequency below the nominal line frequency of said alternating current.

10. The electrical device as recited in claim 8, wherein said alternating current has a nominal line frequency and said selected frequencies of said alternating current are generally greater than a first frequency above the nominal line frequency of said alternating current and said other selected frequencies of said alternating current are generally below a second frequency below the nominal line frequency of said alternating current in order that said at least one filter means is a band-pass filter.

11. The electrical device as recited in claim 5, wherein said determining means is a microcomputer having an analog-to-digital converter for converting said output signal of each of said at least one filter means to a digital value related to said alternating current.

12. The electrical device as recited in claim 5, wherein said at least one filter means comprises three filter means for filtering the output signals of three current transformers.

13. The electrical device as recited in claim 10, wherein said at least one filter means further has an operational amplifier for providing said output signal of said at least one filter means.

14. The electrical device as recited in claim 11, wherein said microcomputer has means for calculating at least one digital value equal to a value of said alternating current.

15. The electrical device as recited in claim 14, wherein said power source is a three-phase power source having a three-phase alternating current, and wherein said at least one filter means comprises three filter means for filtering the output signals of three current transformers in order that said means for calculating calculates three digital values equal to said three-phase alternating current.

16. The electrical device as recited in claim 15, wherein said alternating current has a silicon controlled rectifier chopped waveform.

17. An electrical device interfacing at least one alternating current transformer, each of said at least one alternating current transformer having an output providing a signal proportional to changes in alternating current flowing from a power source to a load, said electrical device comprising:

at least one filter means for filtering said output signal of said at least one current transformer, each of said at least one filter means having an output connected to said output of said at least one alternating current transformer and an output providing a signal proportional to said output signal of said at least one alternating current transformer and inversely proportional to selected frequencies of said alternating current; and means for determining an output value related to said alternating current, said determining means connected to said output of each of said at least one filter means and having an output providing a value related to said alternating current, wherein said determining means is a rectifier having means for inverting said output signal of each of said at least one filter means to produce an inverted output signal and means for summing only one polarity of said output signal and said inverted output signal and said inverted output signal in order that said output value related to said alternating current equals a sum of said signals of said one polarity, wherein said rectifier further has means for amplifying the sum of said signals of said one polarity in order that said output value equals a value of said alternating current.

18. The electrical device as recited in claim 17, wherein said at least one filter means comprises three filter means for filtering the output signals of three current transformers in order that said output value is a three-phase alternating current value.

19. The electrical device as recited in claim 18, wherein said alternating current has a silicon controlled rectifier chopped waveform.

* * * * *